(12) United States Patent
Maturo et al.

(10) Patent No.: US 10,505,317 B2
(45) Date of Patent: Dec. 10, 2019

(54) CONSTANT IMPEDANCE CONNECTOR SYSTEM

(71) Applicant: The Phoenix Company of Chicago, Inc., Itasca, IL (US)

(72) Inventors: John E. Maturo, Thomaston, CT (US); Robert M. Bradley, Oakville, CT (US)

(73) Assignee: The Phoenix Company of Chicago, Inc., Itasca, IL (US)

( * ) Notice: Subject to any disclaimer, the term of this patent is extended or adjusted under 35 U.S.C. 154(b) by 0 days.

(21) Appl. No.: 16/392,736

(22) Filed: Apr. 24, 2019

(65) Prior Publication Data

US 2019/0252827 A1    Aug. 15, 2019

Related U.S. Application Data

(63) Continuation-in-part of application No. 15/989,328, filed on May 25, 2018, now Pat. No. 10,320,133, which is a continuation-in-part of application No. 15/608,168, filed on May 30, 2017, now Pat. No. 10,049,788.

(51) Int. Cl.
| | |
|---|---|
| H01R 9/05 | (2006.01) |
| H01R 13/6473 | (2011.01) |
| H01R 31/06 | (2006.01) |
| H01R 13/52 | (2006.01) |
| H01R 25/00 | (2006.01) |
| H01R 13/74 | (2006.01) |

(52) U.S. Cl.
CPC ..... *H01R 13/6473* (2013.01); *H01R 13/5202* (2013.01); *H01R 13/5208* (2013.01); *H01R 13/74* (2013.01); *H01R 25/006* (2013.01); *H01R 31/065* (2013.01)

(58) Field of Classification Search
CPC .............. H01R 13/6473; H01R 31/065; H01R 13/5208; H01R 25/006; H01R 13/74; H04L 9/0822
USPC ........................................................ 439/578
See application file for complete search history.

(56) References Cited

U.S. PATENT DOCUMENTS

| | | | |
|---|---|---|---|
| 3,011,143 A | 10/1959 | Dean | |
| 3,694,793 A | 9/1972 | Concelman | |
| 5,055,068 A | 10/1991 | Machura | |
| 5,360,330 A | 11/1994 | Jensen | |
| 6,224,421 B1 | 5/2001 | Maturo | |
| 6,595,801 B1 | 7/2003 | Leonard | |
| 6,863,565 B1 | 3/2005 | Kogan | |
| 6,905,367 B2 | 6/2005 | Crane | |

(Continued)

*Primary Examiner* — Jean F Duverne
(74) *Attorney, Agent, or Firm* — DeLio Peterson & Curcio LLC; Robert Curcio

(57) ABSTRACT

A signal connection system that employs constant impedance connectors with attenuation or filtering components or both embedded therein or within an adaptor removably insertable within an adaptor housing. The connection system provides a higher density of cables traversing through a hermetic sealed top plate, and which are accessible to chill blocks to reduce the thermal energy from the signal lines. Attenuators or filter circuits are embedded in constant impedance connector header housings, or provided in adaptors that connect on each end to form mating constant impedance connections, in order to reduce signal strength as the signal progresses through the connection system and to remove extraneous electrical signal noise.

17 Claims, 17 Drawing Sheets

(56) References Cited

U.S. PATENT DOCUMENTS

| | | | |
|---|---|---|---|
| 7,029,286 B2 | 4/2006 | Hall | |
| 7,972,172 B2 | 7/2011 | Huang | |
| 9,559,480 B2 | 1/2017 | Bradley et al. | |
| 9,559,840 B2 * | 1/2017 | Ponceleon | H04L 9/0822 |
| 10,049,788 B1 | 8/2018 | Maturo | |
| 2001/0053228 A1 | 12/2001 | Jones | |
| 2002/0176137 A1 | 12/2002 | BuAbbud | |
| 2005/0176268 A1 | 8/2005 | Zaderej | |
| 2005/0215121 A1 | 9/2005 | Tokunaga | |
| 2006/0139117 A1 | 6/2006 | Brunker | |
| 2008/0045079 A1 | 2/2008 | Minich | |
| 2011/0281461 A1 | 11/2011 | Yon | |
| 2013/0273756 A1 | 10/2013 | Stoner | |
| 2014/0253259 A1 | 9/2014 | Holland | |

* cited by examiner

CONSTANT IMPEDANCE CONNECTOR SYSTEM

BACKGROUND OF THE INVENTION

1. Field of the Invention

The present invention relates to a constant impedance connector system, utilizing the characteristics of known constant impedance connectors, some with embedded attenuation and/or filtering components. The constant impedance connector system is designed for use in computer technology, and to the connection system for a quantum computer. More specifically, the present invention may be adapted for use in a cryogenically cooled quantum computer. The constant impedance connectors may be in the form of replaceable adapters.

2. Description of Related Art

Today's computers work by manipulating bits that exist in one of two states: a 0 or a 1. Quantum computers, however, are not limited to two states; they encode information as quantum bits, or qubits, which can exist in superposition. Qubits represent atoms, ions, photons, or electrons and their respective control devices that are working together to act as computer memory and/or a processor. Because a quantum computer can contain these multiple states simultaneously, it has the potential to be millions of times more powerful than today's most powerful supercomputers.

This superposition of qubits is what gives quantum computers their inherent parallelism. This parallelism allows a quantum computer to work on a million computations at once.

As the physical attributes of the qubits continue to advance, meeting the challenge of realizing a quantum machine requires the engineering of new hardware and control architectures with complexity far beyond today's systems. One such system advancement is the implementation of computing at cryogenic temperatures using superconductor-based components. There are many benefits of cryogenic operation, such as: increased mobility and saturation velocity of the carriers, leading to higher operation speed; lower noise levels; increased electrical conductivity; increased integration densities; and the suppression of thermally activated degradation processes, to name a few. The drawbacks of cryogenic operation include: the necessity for an appropriate cooling system; the selection of materials and components optimized for low temperature operation; and, interfacing aspects between "cold" and "warm" electronics, among others.

SUMMARY OF THE INVENTION

Bearing in mind the problems and deficiencies of the prior art, it is therefore an object of the present invention to provide a connection system capable of operating in an isolated environment with the ability to traverse through an external environment to an internal environment.

It is another object of the present invention to provide a connection system that presents a higher density of cables than the current state-of-the-art assemblies.

It is a further object of the present invention to accommodate system electrical attenuation in order to reduce the thermal energy resulting from transmitted signal power.

It is another object of the present invention to establish a hermetic seal in-line with the system cabling.

It is another object of the present invention to provide a connection system that can be installed within a quantum computer operating system, and which can be easily assembled in the computer system without damage to the extremely small diameter center conductors of the cabling.

It is yet another object of the present invention to accommodate system electrical filtering in a cryogenic environment in order to reduce extraneous electrical signals (noise) coupled onto conductors.

The above and other objects, which will be apparent to those skilled in the art, are achieved in the present invention which is directed to a connection system for transmitting signal cables through tiered stages, wherein at least one stage comprises: a first plurality of signal cables, each having a center conductor terminated by a first constant impedance receptacle connector or first constant impedance plug connector; a cube-shaped or three-dimensional trapezoidal header housing mounted to a first plate, and having multiple exposed side faces, the header housing having a first header housing constant impedance receptacle connector or a first header housing constant impedance plug connector mounted on at least one of the multiple exposed side faces, and adapted to receive a constant impedance receptacle connector or a constant impedance plug connector, wherein the first header housing connector mounted on at least one of the multiple exposed side faces is complementary to the second constant impedance receptacle connector or the second constant impedance plug connector; and wherein the cube-shaped or three-dimensional trapezoidal header housing is secured to the first plate forming a hermetic seal for transporting the plurality of signal cables from an outside environment to an internal, hermetically sealed environment.

The connection system further includes a second connector housing securing a second plurality of signal cables, wherein the second plurality of signal cables each has a center conductor terminated by the second constant impedance receptacle connector or the second constant impedance plug connector, wherein the second connector housing's second plurality of signal cables are complementary to the first header housing constant impedance receptacle connectors or first header housing constant impedance plug connectors, such that the second connector housing attaches to the first header housing to form constant impedance cable connections.

The first header housing constant impedance receptacle connector or the first header housing constant impedance plug connector is preferably mounted on the at least one of the multiple exposed side faces in a direction facing outward relative to the first plate.

A seal located is on each side of the at least one of the multiple exposed side faces for sealing the center conductor passing therethrough.

The first header housing may include a removable attenuator or filter component connected at one end to the first header housing constant impedance plug connector and at an opposing end to the first header housing constant impedance receptacle connector, for signal attenuation and/or electrical signal filtering of the first and second signal cables.

The first plate is a heat sink or a ground potential or both for constant impedance connectors, attenuators, and/or filters.

The second constant impedance receptacle connector or the second constant impedance plug connector of the second cable includes an attenuator or filter component embedded therein for signal attenuation and/or electrical signal filtering of the first and second signal cables.

The connection system may further include: a plug housing block or a receptacle housing block for terminating the second plurality of signal cables, wherein the plug housing block includes a constant impedance plug connector for each of the second plurality of signal cables, or a constant impedance receptacle connector for each of the second plurality of signal cables; an adaptor housing having a plurality of apertures for mounting attenuator housings, filter housings, or both, each of the attenuator housings and/or filter housings associated with a signal cable, and having a complementary constant impedance connector on a first side of the adaptor housing for connecting with a reciprocal constant impedance connector of the plug housing block; and a receptacle housing block for connecting to the adaptor housing on a second side, the receptacle housing block including constant impedance plug connectors in electrical communication with the second plurality of signal cables, or constant impedance receptacle connectors in electrical communication with the second plurality of signal cables, and having a third plurality of signal cables extending therefrom; wherein the receptacle housing block connected to the adaptor housing on the adaptor housing second side, such that a complementary constant impedance connector of receptacle housing block connects to a complementary constant impedance connector of the adaptor housing second side.

The attenuator housing, the filter housing, or both, each include a resilient component for electrical communication, thermal communication, electromagnetic interference protection, or any combination thereof, to an inner wall of each respective aperture of the adaptor housing.

The connection system may include at least one additional plate for mounting a second lower housing stage, the second lower housing stage comprising modified constant impedance connectors in electrical communication with the third plurality of signal cables, the modified constant impedance connectors each having a second attenuator or second filter component embedded therein for signal attenuation or electrical signal filtering.

The connection system may further include at least one signal cable board internal to the cube-shaped or three-dimensional trapezoidal header housing for each of the multiple exposed side faces having constant impedance receptacle or plug connectors, the signal cable board having a plurality of signal cable terminations in corresponding electrical communication with the first plurality of signal cables.

In a second aspect, the present invention is directed to a connection system for transmitting signal cables through tiered stages, wherein at least one stage comprises: a first plurality of signal cables, each having a center conductor terminated by a first constant impedance receptacle connector or first constant impedance plug connector; a cube-shaped header housing mounted to a first plate, and having multiple exposed side faces and a top face wherein each side face and the top face present constant impedance receptacle connectors or constant impedance plugs mounted thereon, and are adapted to receive reciprocal constant impedance receptacle connectors or a constant impedance plug connectors, such that the first header housing connector or plug is complementary to the second constant impedance receptacle connector or the second constant impedance plug connector; and wherein the cube-shaped header housing is secured to the first plate forming a hermetic seal for transporting the plurality of signal cables from an outside environment to an internal, hermetically sealed environment.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
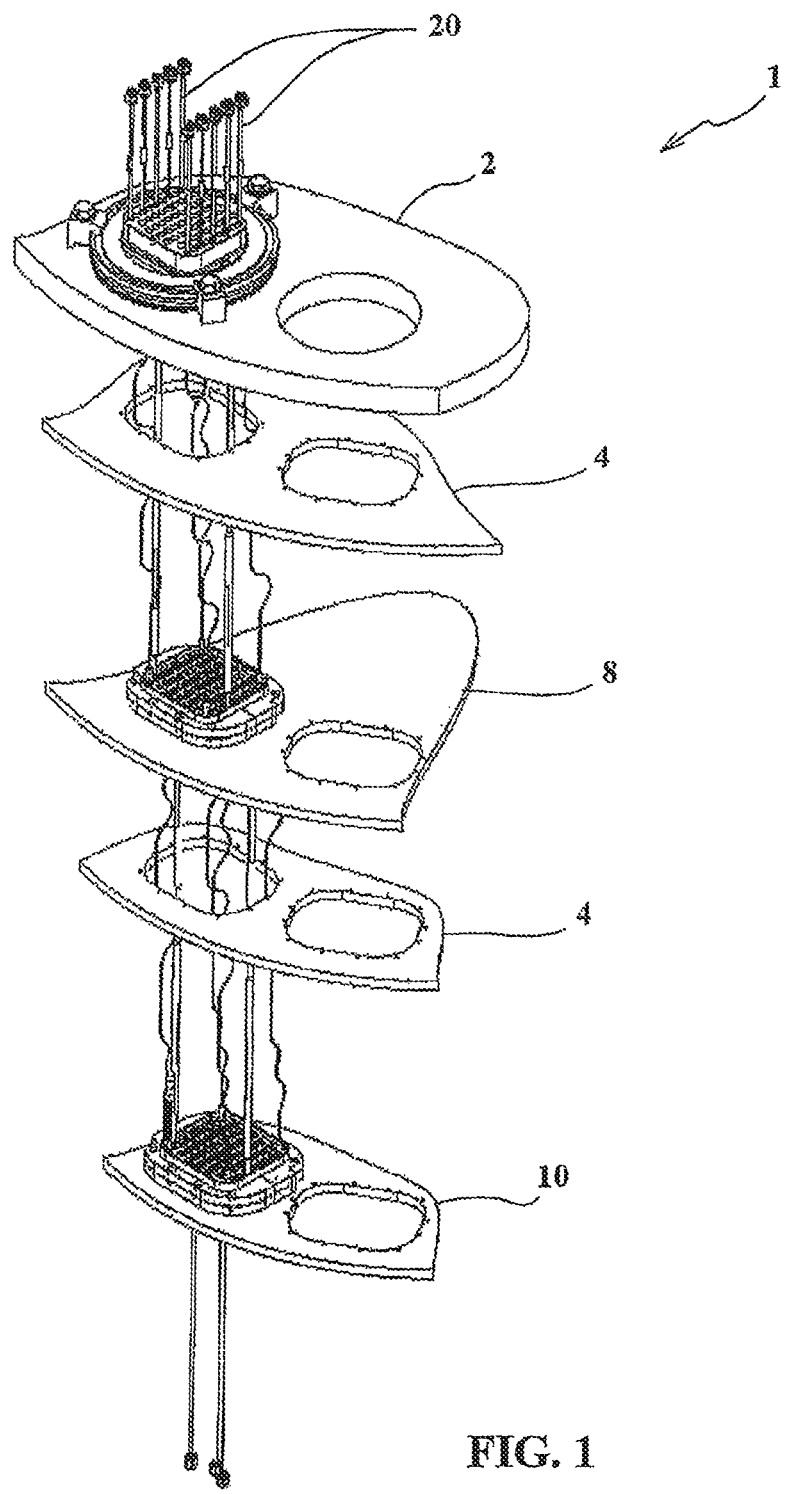
FIG. 1 is a perspective view of one embodiment of the connector system of the present invention.

In describing the preferred embodiment of the present invention, reference will be made herein to FIGS. 1-17 of the drawings in which like numerals refer to like features of the invention.

The present invention provides a connection system for electrical signals. The invention is preferably used to accommodate computer architecture, and preferably quantum computer architecture, although uses outside of computer architecture are not prohibited. For illustrative purposes, the application of the connection system of the present invention is demonstrated in computer architecture; however, other uses for electrical signal protection using the connection system are not precluded.

In one embodiment, the present invention lends itself to operation in a cryogenically cooled environment, although the present invention is not limited to cryogenically cooled environment applications. The need for reducing input power that would otherwise provide degrading thermal effects to the internal system is mitigated through the introduction of attenuators embedded within the housing of specialized constant impedance connectors, or formed as adapters that are designed to extend a constant impedance connection. In both instances the connectors are designed with a direct thermal connection to heat sinking elements, such as refrigeration plates, or the like. In certain instances, the attenuators are cryogenically-design. Similarly, in lieu of, or in addition to, attenuators, the present invention may also accommodate filters that are either embedded within the housing of specialized constant impedance connectors or attached as adapters to extend the constant impedance connections.

The design for embedding attenuators or providing an attenuating adaptor that extends a constant impedance connector readily lends itself to the implementation of filtering components within the connector or adaptor housing to reduce unwarranted coupling on the signal lines. In this manner, extraneous power on the line is further reduced by shunting at least a portion of the electrically coupled noise to ground before it travels to the colder portions of the cryogenically cooled environment.

Standardized constant impedance connectors accommodate large radial and axial misalignment tolerances found in modular applications. Constant impedance technology, as that found in the PkZ® connectors of Palco Connector, Inc., of Naugatuck, Conn.—an affiliate of The Phoenix Company of Chicago—ensures constant impedance with low insertion forces and no internal engagement spring. These connectors provide consistent performance by maintaining constant impedance over the larger Z-axis mating gaps caused by system and connector tolerance challenges. This is advantageous over the SMA connectors of the prior art, which are generally threaded and unable to accommodate movement of components at low temperatures. The Palco PkZ® connectors are implemented in this design as exemplary constant impedance connectors that will maintain signal integrity in a challenging environment.

The operating signals may be either RF or digital signals, typically in frequencies less than 40 GHz, but may be as high as 40 GHz to 60 GHz, with approximately 1 watt max power. This is in contrast to SMA connectors currently found in the art, which operate on the order of less than 20 GHz.

FIG. 1 is a perspective view of one embodiment of the connector system 1 of the present invention. The input signals travel through connector system 1 via mounting and connecting blocks with cables extending there between. Top plate 2 receives input cables 20 from an external, uncontrolled or less controlled environment, such as a less controlled temperature environment. The center conductors of the cables pass through top plate 2 in a manner that secures and maintains a hermetic seal. After traversing through top plate 2, the signals are carried via cabling through at least one additional plate 4, which may be a plate used for heat sinking, and more preferably, a plurality of plates, to reduce and maintain a lower temperature for cryogenic applications. Such plates act as heat sinks for thermal energy, which aid in prohibiting the thermal energy from transmitting further down the connector system. The signals are then connected via cabling to a lower housing stage 8 which is downstream of the top plate 2, and which utilizes a modified constant impedance connector, such as a PkZ® connector. The signal lines then traverse to a bottom housing stage 10 through which the signal lines then progress to the internal computer electronics.

Figure 4:
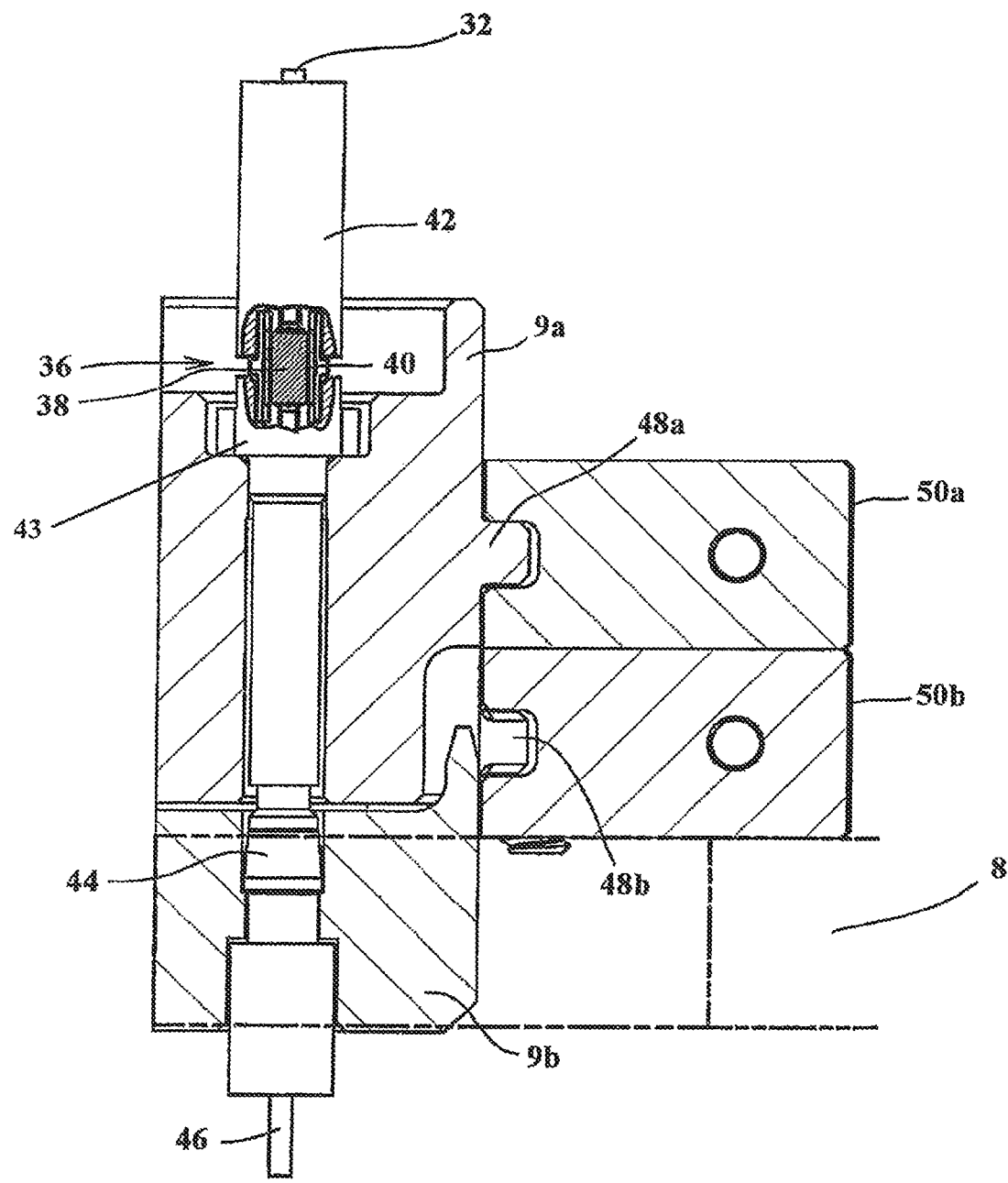
FIG. 4 depicts the center stage of the connector system where signal attenuation is achieved.

As will be discussed in further detail below, the modification of the constant impedance connection may be presented in different distinct designs and at different stages. For example, in a first embodiment, an attenuator or filter is embedded in either a constant impedance connector receptacle or plug. As depicted in FIG. 4, the connector receptacle is installed into a receptacle housing block 9a, and the connector plug is installed into a plug housing block 9b, such that when the receptacle housing block 9a is mated to the plug housing block 9b, the receptacle and plug connectors are mated as well.

This allows for proper alignment of the contacts and thermal dissipation through the housing blocks.

In a second embodiment an attenuator component or filter component adaptor is employed within its own adapter body which is then mounted into an adaptor housing, which preferably accommodates a plurality of adaptor bodies. The adaptor housing is then mounted to a plate, such as a refrigeration plate. The adaptor housing will receive on one side connectors from a receptacle housing block, and on the other side connectors from a plug housing block. It is also possible for an adaptor housing to be designed to receive connectors from a receptacle housing block on both sides, or connectors from a plug housing block on both sides, such that, in either embodiment, a constant impedance connection is made on each side of the adaptor housing.

The attenuator lowers the power on each center conductor without changing the signal integrity. In cooling applications, the excess thermal energy from the attenuated signals is then dissipated through the housing to a heat sink, such as refrigeration plate. The system is designed to accommodate a plurality of such heat sinks. Additional plates may have further attenuation components for further signal conditioning. External cabling then extends from bottom housing stage 10 to the computer internal electronics, and ultimately to the processor.

It is noted that for optimum operation of the connection system within a quantum computer application most or approximately all of the materials of the connection system are designed of non-magnetic material. For other applications, non-magnetic material may not be necessitated.

Figure 2:
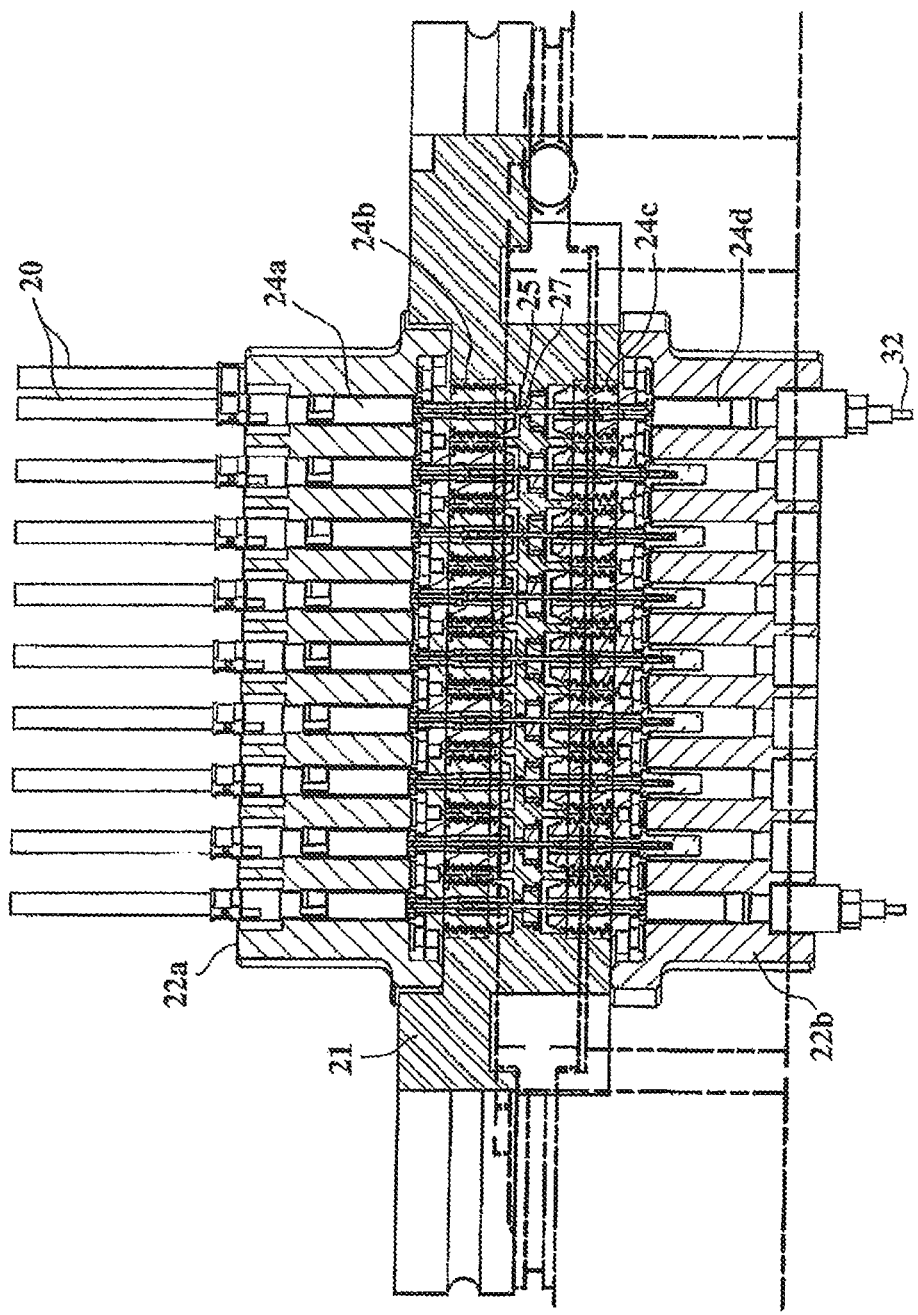
FIG. 2 is a cross-sectional view of the top plate of the connector system of FIG. 1 with a hermetic header housing attached thereto.

FIG. 2 is a cross-sectional view of top plate 2 of connector system 1 with a hermetic header housing 21. Top plate 2 introduces a hermetic seal in the signal lines. This is accomplished by mounting hermitic header housing 21 on top plate 2. Hermetic header housing 21 passes through an aperture in top plate 2. In this manner, downstream signal cables and electronics are sealed from the outside environment. In this embodiment, on one side of top plate 2, incoming cables 20 are attached to a connector housing 22a.

Connector housing 22a terminates the signal cables at a constant impedance receptacle connector 24a. Alternatively, the signal cables may be terminated at a constant impedance plug connector, as receptacles and plugs may be interchanged without loss of design function. The connector housing 22a then connects to the top side of the hermetic header housing 21. The hermetic header housing 21 on its top side has reciprocal constant impedance plugs 24b for mating with the constant impedance receptacles 24a of connector housing 22a. The center conductor 25 runs through a hermetic seal material 27 within the hermetic header housing 21. On the bottom side of top plate 2, which correlates with the bottom side of hermetic header housing 21, a constant impedance plug 24c is installed for each signal line. A connector housing 22b then connects to the bottom side of the hermetic header housing 21. Connector housing 22b has reciprocal constant impedance receptacle connectors 24d to mate with constant impedance plugs 24c.

Figure 3:
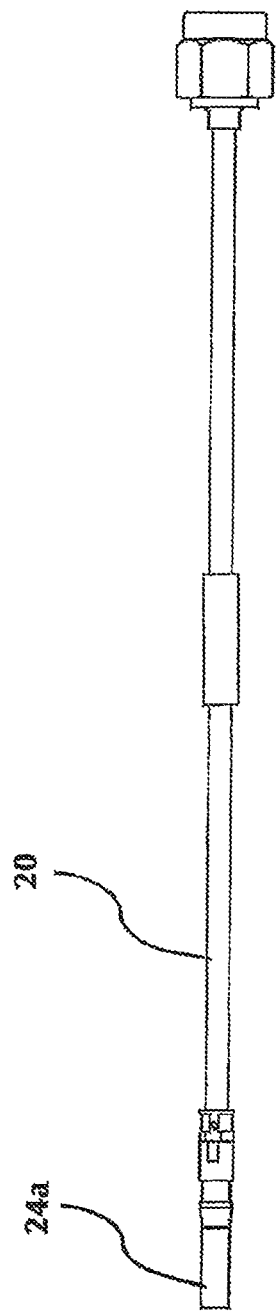
FIG. 3 depicts an illustrative example of an incoming cable with a connector housing for connection to the top plate of FIG. 2.

FIG. 3 depicts an illustrative embodiment of incoming cable 20 for installation into connector housing 22. A first, standard constant impedance receptacle 24a is attached thereto. The standard PkZ® receptacle is preferably a commercially available type constant impedance connector, such as that available from Palco Connector, Inc., or an equivalent thereof. It should be noted that where receptacles are utilized, plug connectors may be employed, and where plug connectors are utilized, receptacle connectors may be employed, without degradation to the constant impedance connection.

Figure 12:
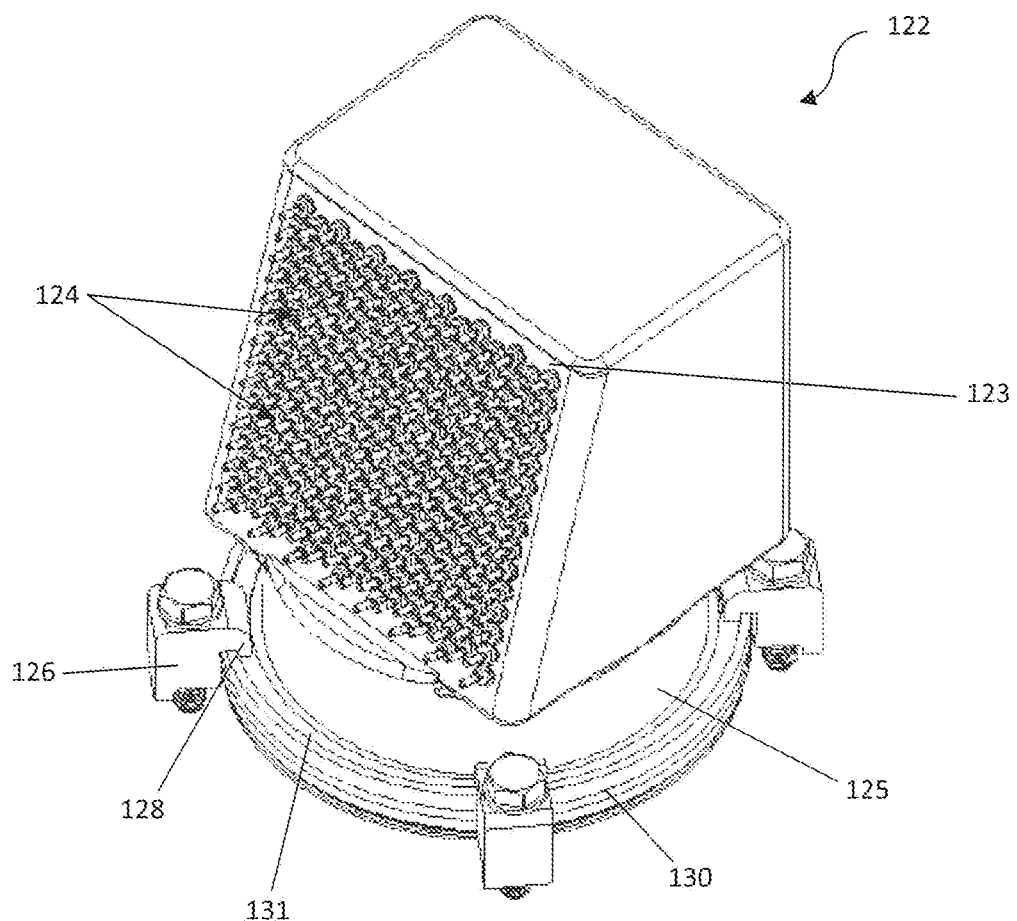
FIG. 12 depicts a second connector housing embodiment.

FIG. 12 depicts a second connector header housing embodiment 122. The complexity of configuring multiple signal cables and terminating connectors in a single package or header housing remains an increasing mechanical challenge. Second connector header housing 122 presents an approximate cube-shaped or trapezoidal hermetic header housing with at least one angled side face 123 for presenting the termination connectors 124 for each signal received from either individual signal cables, or preferably a connector housing (not shown) that secures multiple signal cables in a single housing plate. Second connector header housing 122 is preferably seated on mounting base 130, shown here as disc-shaped, which is hermetically sealed to top plate 2 via attachment lugs 126. Attachment lugs 126 are preferably compression attachment connections having an extension arm 128 insertable within a groove 131 in a top face of mounting base 130. By providing an upright box-shaped hermetic header housing 122, it is possible to pack tightly multiple signal cables within and present sufficient surface area for external termination connectors 124 in an efficient and functional manner.

Figure 13:
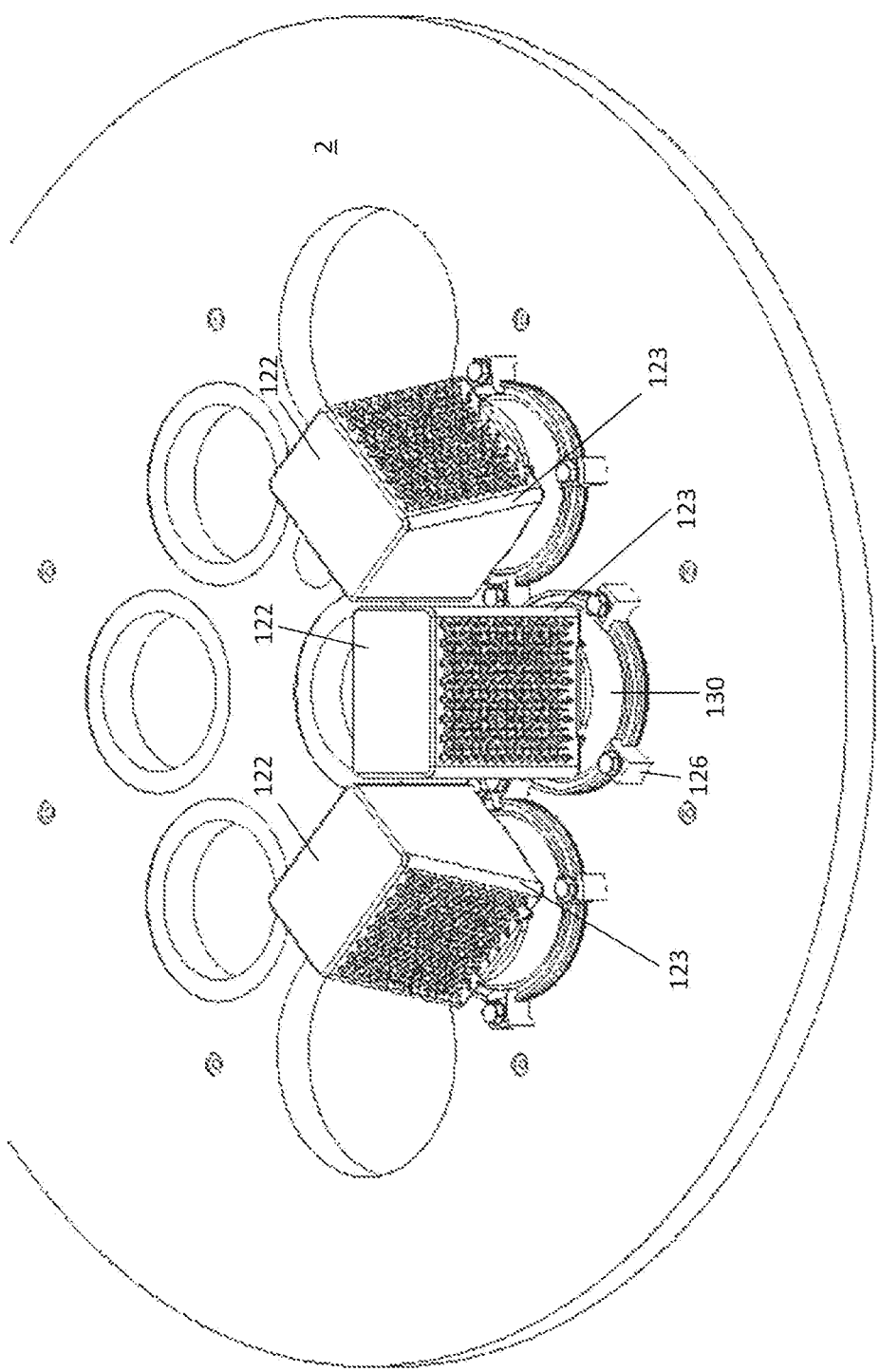
FIG. 13 depicts multiple second connector housings of FIG. 12 configured about the top plate.

FIG. 13 depicts multiple second connector housings 122 of FIG. 12 configured about top plate 2. The angled side faces 123 are presented facing outwards in order to facilitate connecting multiple signal cables to each termination connector 124.

Figure 14:
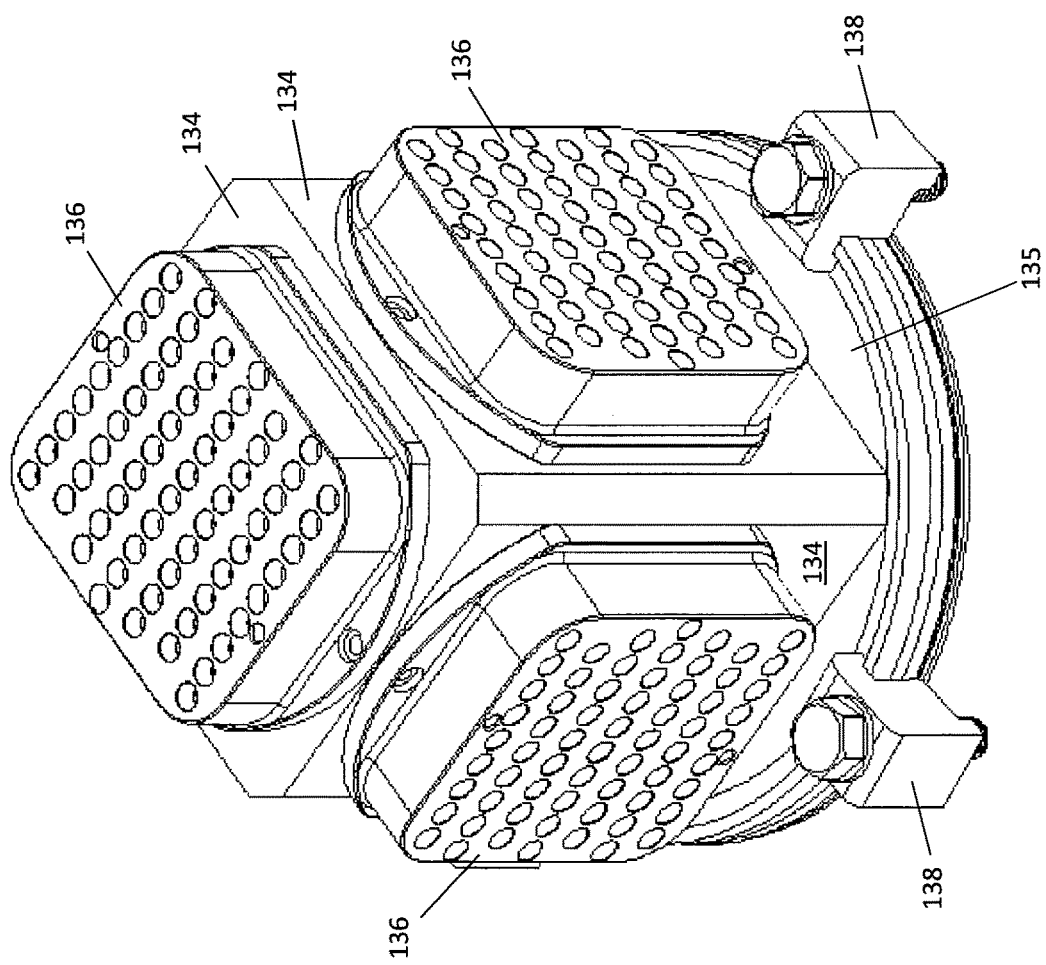
FIG. 14 depicts a third embodiment of a connector housing assembly which is cube-shaped with straight sides, with more than at least one side having a connector termination plate for receiving connector termination.

FIG. 14 depicts a third embodiment of a connector header housing assembly 132 which is cube-shaped with at least three straight sides 134 (depicted here on the top and at least two sidewall panels), with more than at least one side 134 having a connector termination or housing plate 136 for receiving signal cable connector terminations (not shown). Connector header housing assembly 132 is hermetically sealed to top plate 2 via mounting base 135 and attachment lugs 138.

Figure 15:
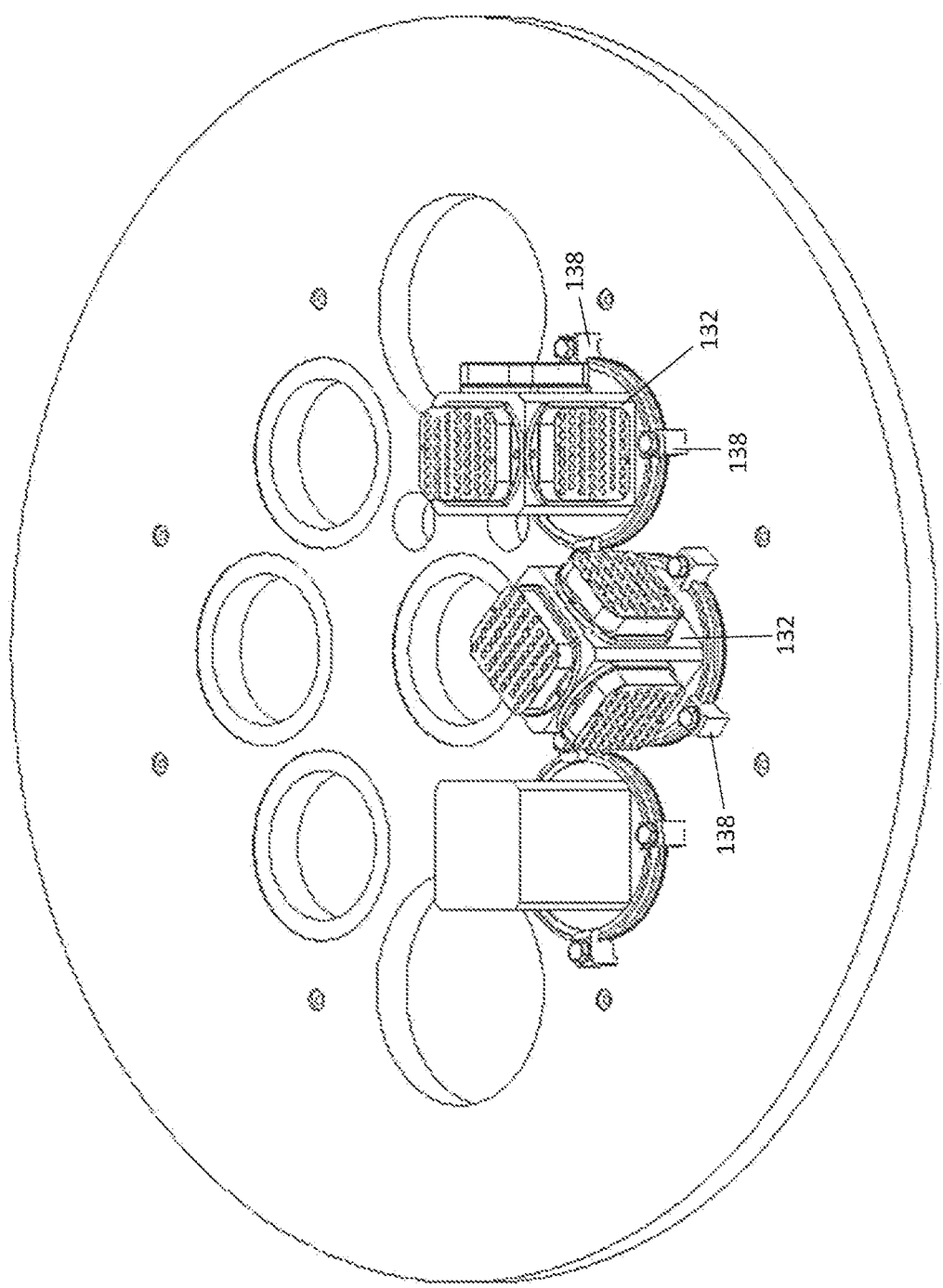
FIG. 15 depicts multiple third connector housing assemblies of FIG. 14 hermetically sealed to the top plate via attachment lugs.

FIG. 15 depicts multiple third connector housing assemblies 132 of FIG. 14 hermetically sealed to top plate 2 via attachment lugs 138.

Figure 16:
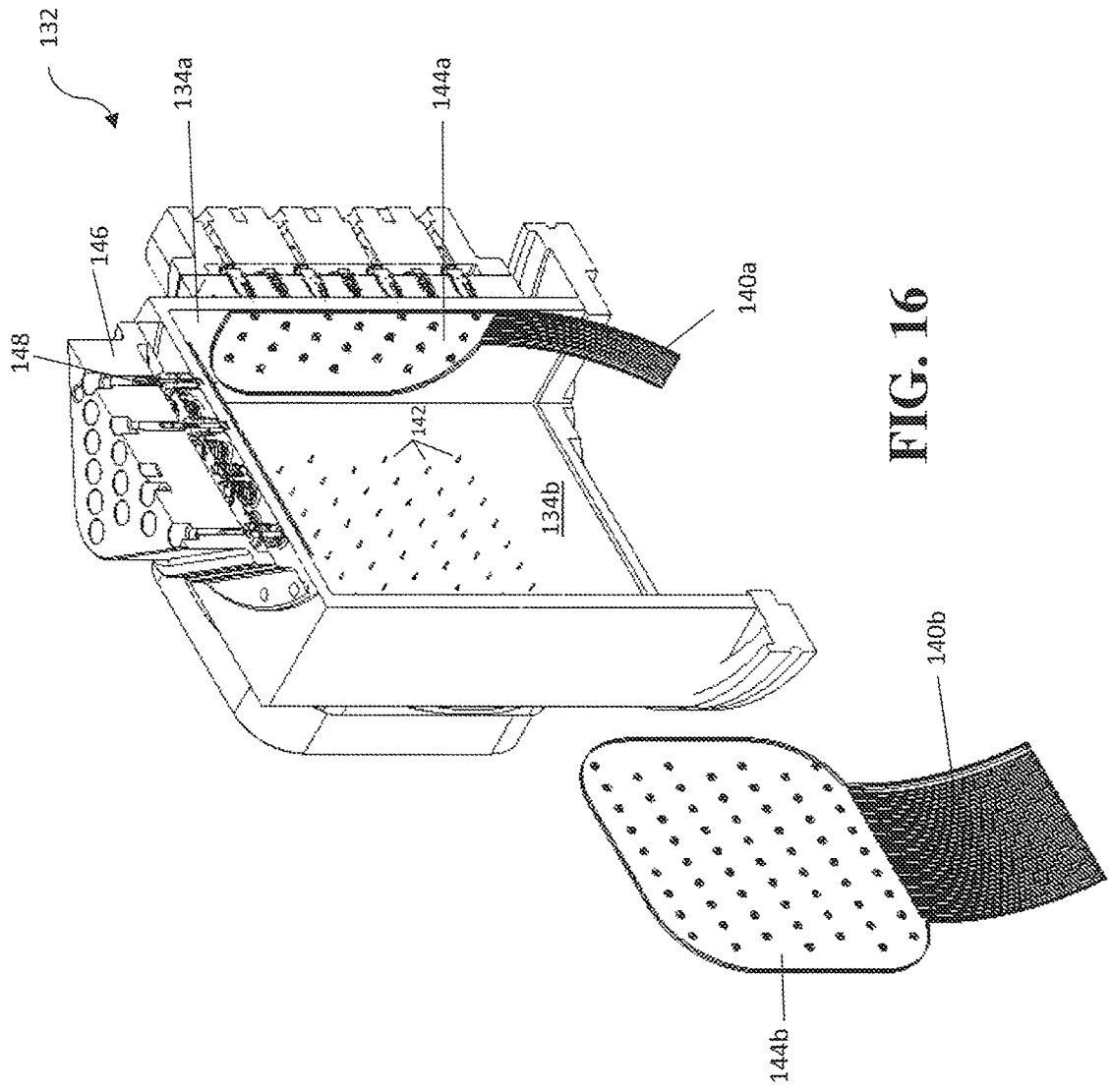
FIG. 16 is a cross-sectional perspective view of the third connector housing assembly of FIG. 14 with a ribbon signal cable shown connected to a side face, and a ribbon cable removed from its side face to demonstrate connector pins for attachment to the signal cable board.

FIG. 16 is a cross-sectional perspective view of the third connector header housing assembly 132 with a ribbon signal cable 140a shown connected to a side face 134a, and a ribbon cable 140b removed from its side face 134b to demonstrate termination connections 142 for attachment to signal cable board 144b. In this configuration, it is possible to have signal cable connections from multiple side faces of third connector housing 132 in a tight, compact wiring configuration within the connector header housing 132. Connector housing plate 146 terminates the signal cables at a constant impedance receptacle connector 148. Alternatively, the signal cables may be terminated at a constant impedance plug connector, as receptacles and plugs may be interchanged without loss of design function.

Figure 17:
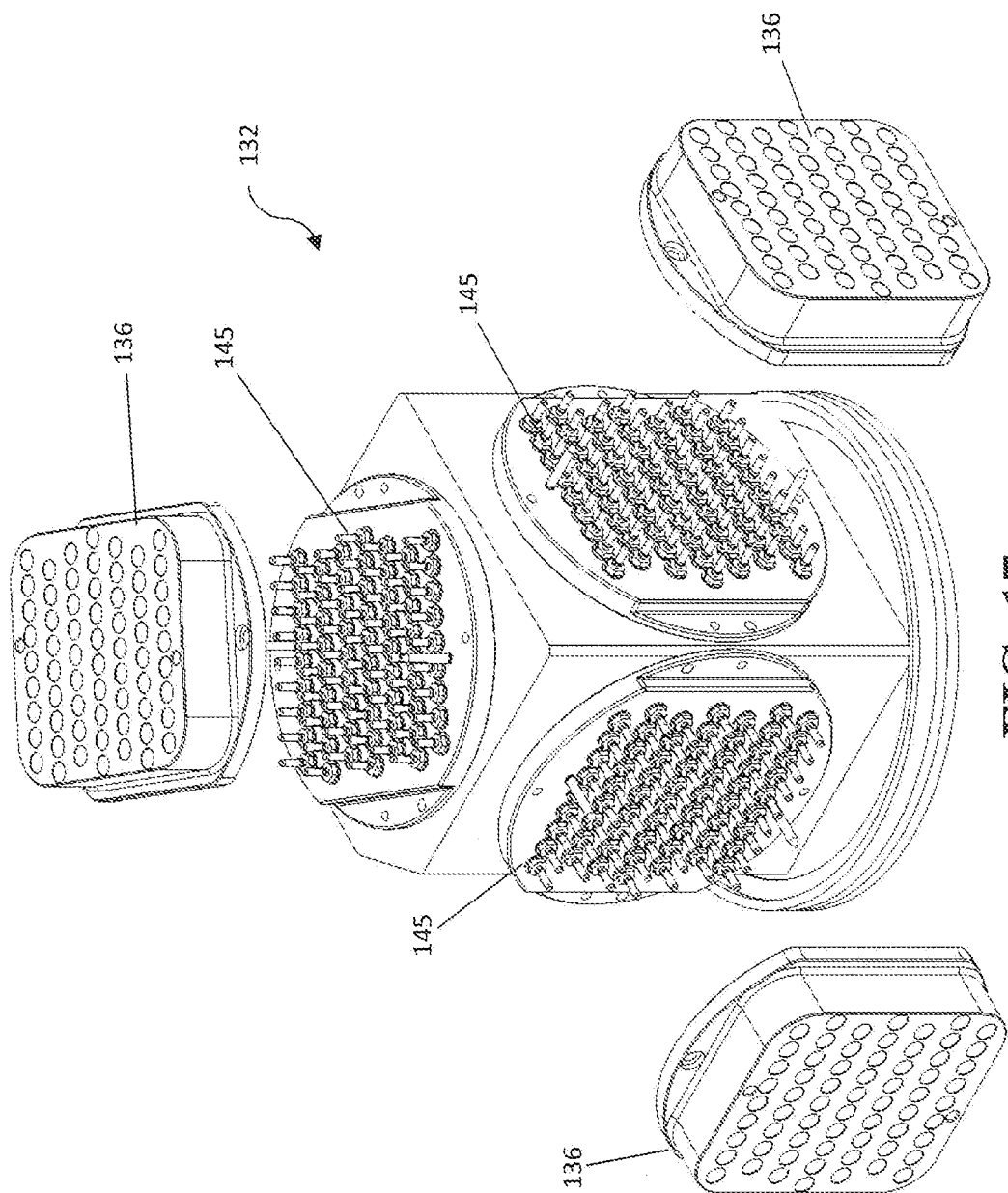
FIG. 17 depicts a three-dimensional perspective view of the third connector housing assembly of FIG. 14 with connector termination plates removed such that connector receiving plates are exposed connected to housing assembly in a hermetic seal fashion.

FIG. 17 depicts a three-dimensional perspective view of the third connector header housing assembly 132 with connector housing plates 136 removed such that connector receiving plates 145 are exposed connected to connector header housing assembly 132 in a hermetic seal fashion. This design allows for connector plugs and connector receptacles of constant impedance connectors to be assembled in a compact configuration on multiple sides of the connector header housing assembly 132.

In each configuration identified above, constant impedance plugs and receptacles are employed as the preferred connectors for the signal lines. The constant impedance connectors may include attenuators or filters as necessary, and as detailed below. The header housing designs further accommodate hermetically sealing the connectors and signal lines from the outside environment.

As will be discussed in further detail below, in an alternative embodiment, a second constant impedance mating plug may be introduced, which is mated with a second constant impedance receptacle. The second receptacle is altered from the first receptacle discussed above insomuch as the second receptacle requires a different internal termination to accommodate a different cable, allowing the connection to proceed from a generally standard cabling material to cabling 32, which may be superconducting cabling material. In this manner, different cabling may be used under a similar connection scheme.

Following the signal cabling from the external environment towards the cryogenically cooled environment, through the hermetic seal stage, the cabling extends from connector housing 22b to lower housing stage 8. FIG. 4 depicts a cross-sectional view of a portion of lower housing stage 8. In this embodiment, the attenuator of the constant impedance connector is press-fitted within the receptacle housing 9a, and is thus not interchangeable or easily repairable. In other embodiments, the attenuator may be secured by a clip ring or mechanical retention retaining ring. As will be shown in a second embodiment, an attenuator or filter adaptor is interchangeable, and would connect on each end to a respective constant impedance receptacle or plug.

In FIG. 4, receptacle housing block 9a performs an attenuation of the cable signals utilizing an embedded attenuator 38. Cabling 32 includes a constant impedance (PkZ®) receptacle 36. PkZ® receptacle 36 is modified to include, internally, attenuator 38. Attenuator 38 may be formed from discrete attenuator electronic components. Other attenuator components may be employed, provided their dimensions are acceptable for insertion within a modified constant impedance connector housing having an upper body portion and a lower body portion, such as PkZ® connector upper housing body portion 42 and lower housing body portion 43. Attenuator 38 may be any level of attenuation depending upon the system requirements. In one embodiment, a 20 dB attenuator is employed. Attenuator 38 is confined within an attenuator housing 40, which is secured within the modified PkZ® receptacle 36.

By attenuating the cable signals, energy is removed from the cables and shunted via the attenuator to the adjoining plate. In this manner, heat energy is kept further away from the internal computer electronics downstream.

Constant impedance receptacle 36 is then mated to a mating plug 44 which is inserted within, and secured by, mating plug housing block 9b. Mating plug 44 extends the signal conductor to a cable 46, which under certain circumstances may be a superconducting cable. Cable 46 does not necessarily have to be the same material as cable 32, and any mating plug would be designed to accommodate the different conducting cable material, including superconducting cabling material.

Receptacle and plug housing blocks 9a, 9b are attached to, and in thermal communication with, lower housing stage 8 via a specialized clamp 50a,b. Clamp 50a,b are each designed to hold extended ribs 48a,b on the perimeter of each housing block 9a,b respectively. Clamps 50a,b are mechanically fastened to lower housing stage 8 on one side via a threaded or other removable attachment scheme. The bottom side of clamp 50b is in thermal communication with lower housing stage 8.

Cables 46 extend from plug housing block 9b and may traverse through one or more plates that may utilize heat sinks, and which may be configured in the same manner as described above.

Figure 5:
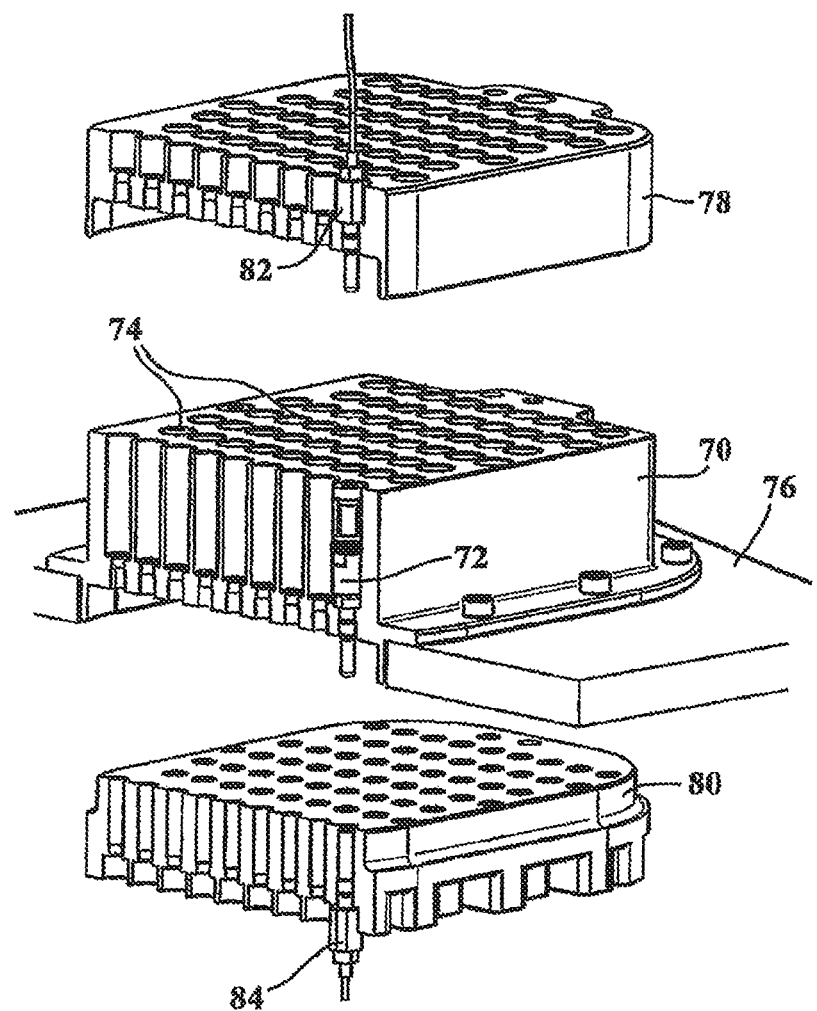
FIG. 5 depicts an exploded, perspective view of an adaptor housing that encloses a plurality of attenuator or filter components, each within respective apertures.

FIG. 5 depicts an exploded, perspective view of an adaptor housing 70 that encloses a plurality of attenuator or filter components 72, each within respective apertures 74, which for illustrative purposes shall be shown as cylindrical apertures although the present invention is not restricted to any given shape. Adaptor housing 70 is attached to plate 76, which is preferably a heat sink plate or a metal structure that provides either thermal conduction for transmitting heat energy, or ground potential for removing filtered signal noise, or both. A plug housing block 78 attaches to adaptor housing 70 on one side, and an a receptacle housing block 80 attaches to adaptor housing 70 on the other side. The plug and receptacle housing blocks 78, 80 each house a mating section of a constant impedance connector, either the receptacle or the plug portion component 82, 84, respectively, for cable connection to the adaptor housing 70 on each side, respectively.

In this manner, one end of the receptacle or plug portion component 82, 84 is a mating constant impedance connector receptacle or plug, which is designed to mate with the complementary attenuator or filter component 72, such that a constant impedance connection is formed. The mating attachment is slidably connected to the receiving attachment on the attenuator or filter component 72. By this design, the attenuator or filter components 72 may be interchangeable, insomuch as attenuator components may be replaced with filter components, and vice versa. As an illustrative example, plug housing block 78 is depicted with a PkZ® plug, and receptacle housing block 80 is depicted with a PkZ® receptacle. The present invention can also accommodate the interchanging of plugs and receptacles so that the constant impedance connection is still maintained.

Figure 6:
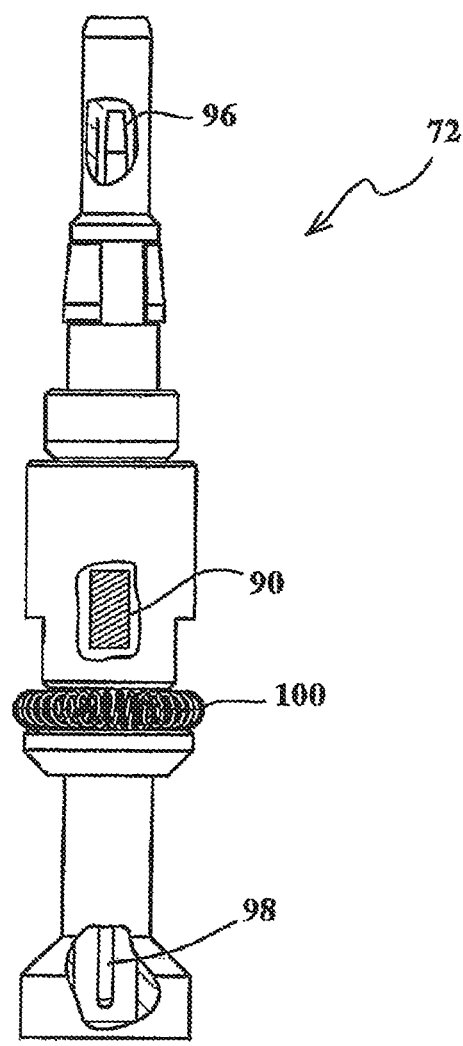
FIG. 6 depicts a cross-sectional view of the attenuator or filter component insertable within the adaptor housing of FIG. 5.

FIG. 6 depicts a partial cross-sectional view of the attenuator or filter component 72. This component includes an attenuator or filter circuit contained in its own removable casing 90 with electrical connections 96, 98 at each end. This attenuator or filter component 72 is insertable within aperture 74 of adaptor housing 70.

A resilient, thermally and/or electrically conductive component 100 is attached to the outside of attenuator or filter component 72 to transmit thermal energy from the attenuator or filter component 72 to the inner wall of aperture 74 upon insertion. The resilient thermally or electrically conductive component 100 may be in the form of a spring or other resilient structure for forming a slideable, compressible connection against the inner wall of aperture 74. The resilient component 100 provides movement and flexibility that a press-fit device (as depicted by the first embodiment above) cannot provide, while assuring improved thermal conductivity and/or electromagnetic interference protection.

Figure 7:
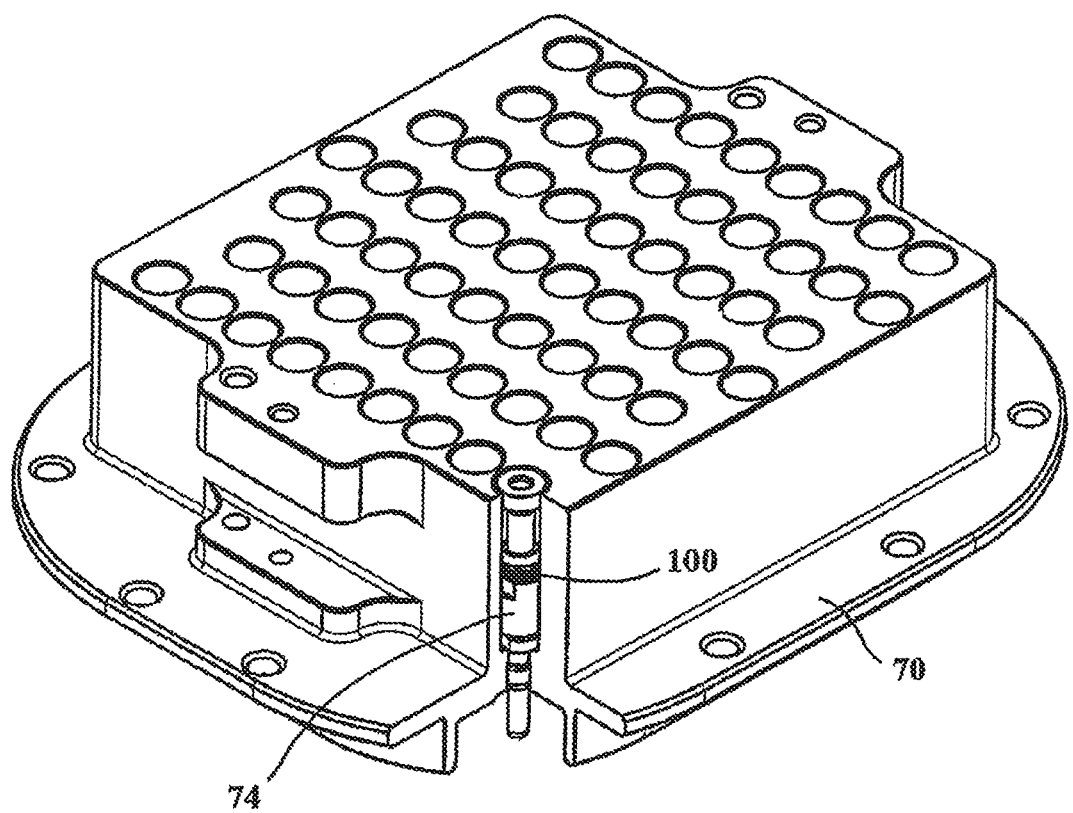
FIG. 7 depicts an exploded, perspective view of the adaptor housing of FIG. 5, where a section of the aperture is shown removed to expose the attenuator or filter component inserted therein.

FIG. 7 depicts an exploded, perspective view of adaptor housing 70 where a section of the aperture 74 is shown removed to expose the attenuator or filter component 72 inserted therein. As shown, resilient component 100 is circumferentially attached to attenuator or filter component 72 such that the outermost side of component 72 is compressibly fit against the inner wall of aperture 74.

Figure 8:
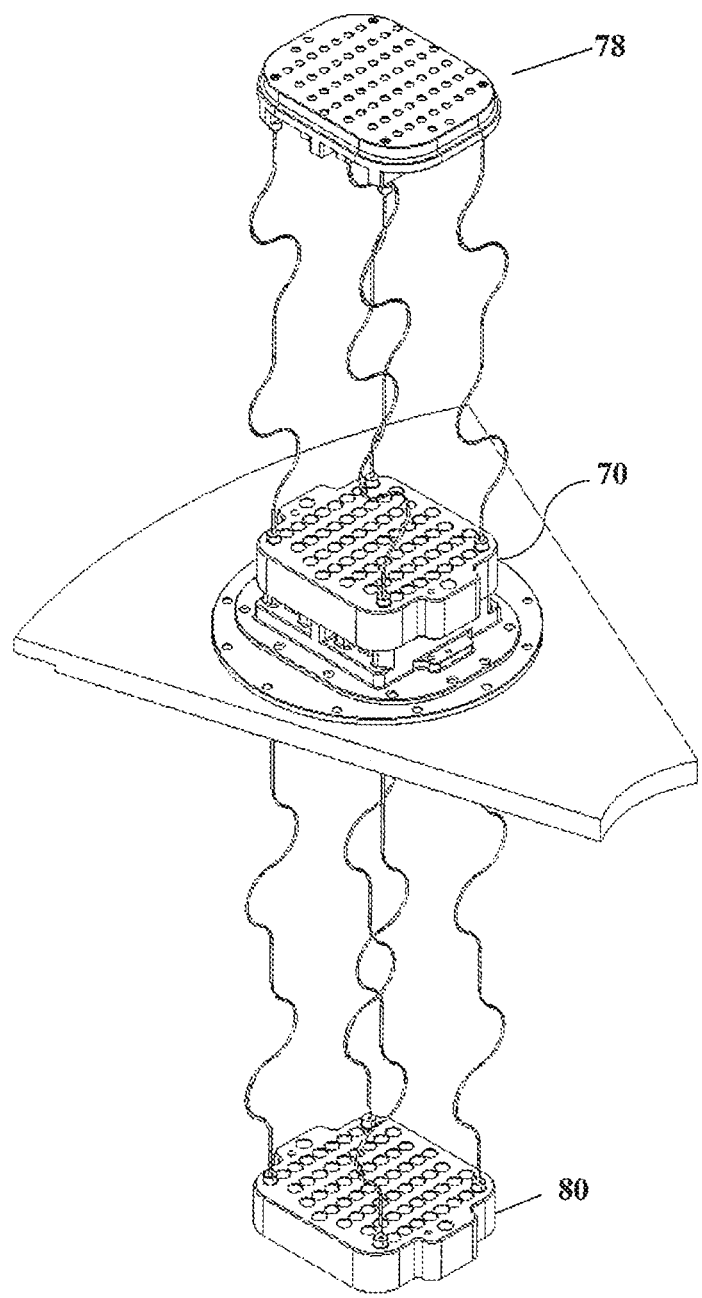
FIG. 8 depicts a plug housing block attached to the adaptor housing of FIG. 5 on one side, and receptacle housing block attached to adaptor housing on the other side.

FIGS. 8-11 depict the method steps for mating the connection system in a computer application. As depicted in FIG. 8, plug housing block 78 is attached to adaptor housing 70 on one side, and receptacle housing block 80 is attached to adaptor housing 70 on the other side, using fixing hardware. Adaptor housing 70 is populated with attenuation adaptors.

Figure 9:
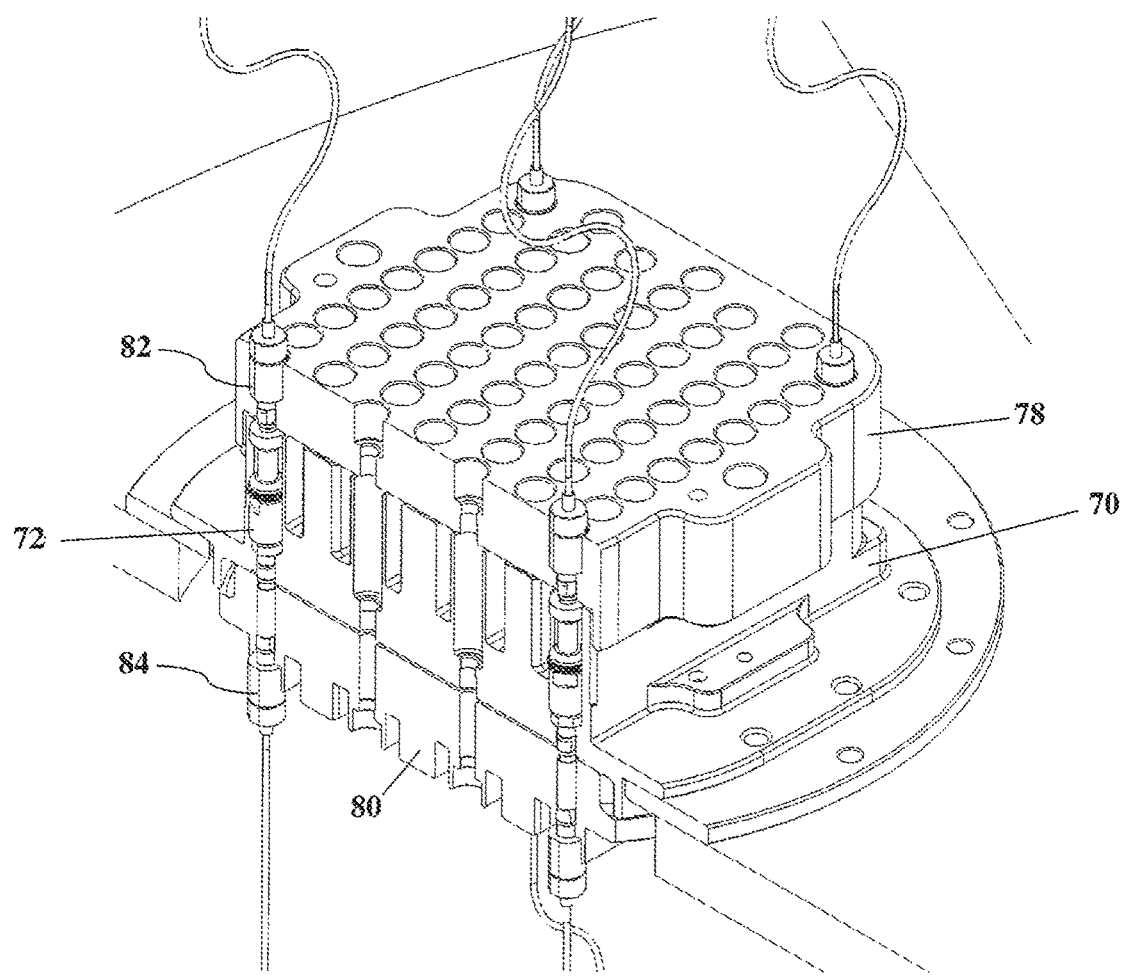
FIG. 9 depicts a cross-section of housing blocks mated to the adaptor housing with attenuation adaptors and plug connectors.

FIG. 9 depicts a cross-section of plug housing blocks 78, 80 mated to the adaptor housing 70 with attenuation adaptors 72 and plug connectors 82, 84 shown.

Figure 10:
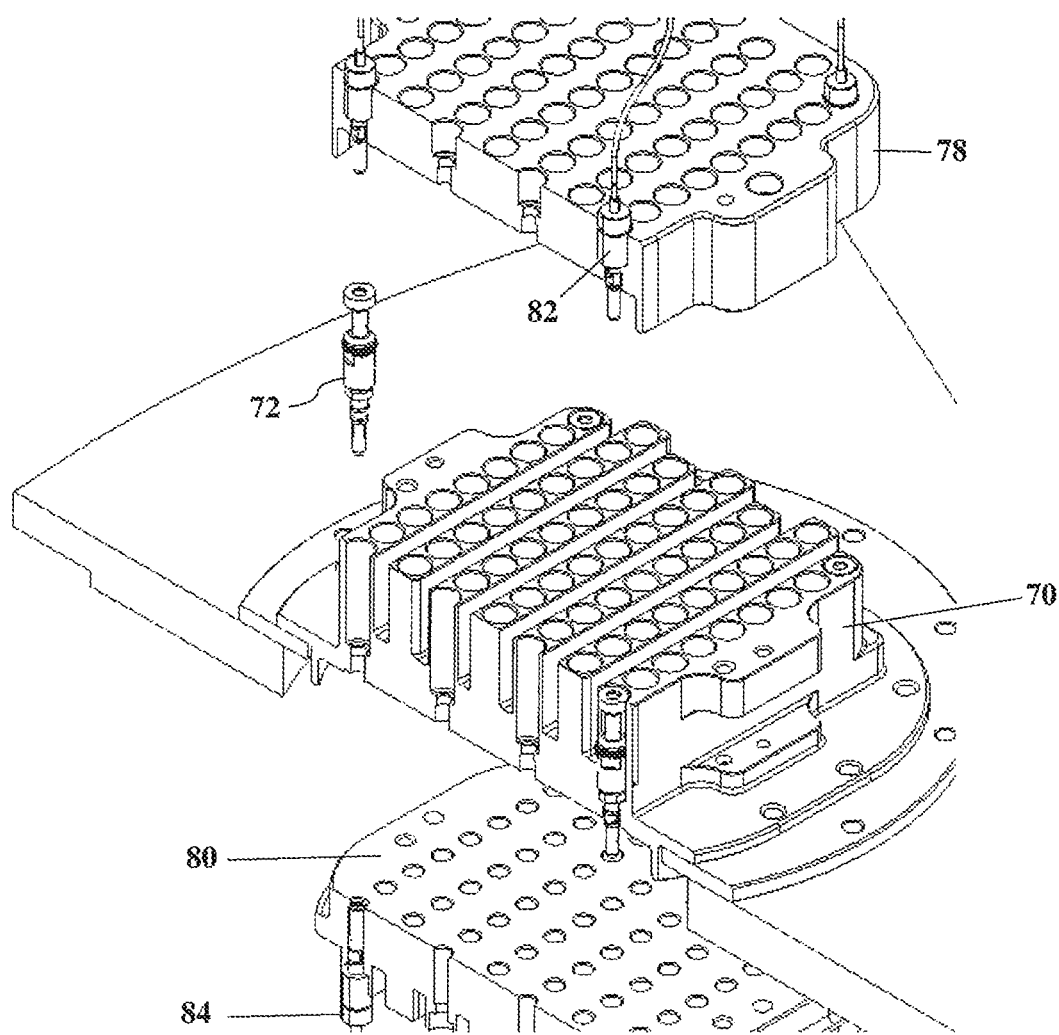
FIG. 10 depicts the separation of the housing blocks for replacement of the attenuation adaptors, and an attenuation adaptor removed therefrom.

In order to replace the attenuation adaptors 72, fixing hardware is removed on both the plug housing block and the receptacle housing block. The connector housings are then removed, and the attenuation adaptors are removed and replaced. FIG. 10 depicts the separation of the housing blocks for replacement of the attenuation adaptors, and an attenuation adaptor removed therefrom.

After separating the connector housing, the attenuation adaptors may be removed using appropriate tools. At this point, the entire housing may be removed for work outside of the connection system environment, or replaced with another housing containing different attenuation adaptors and/or other components.

Figure 11:
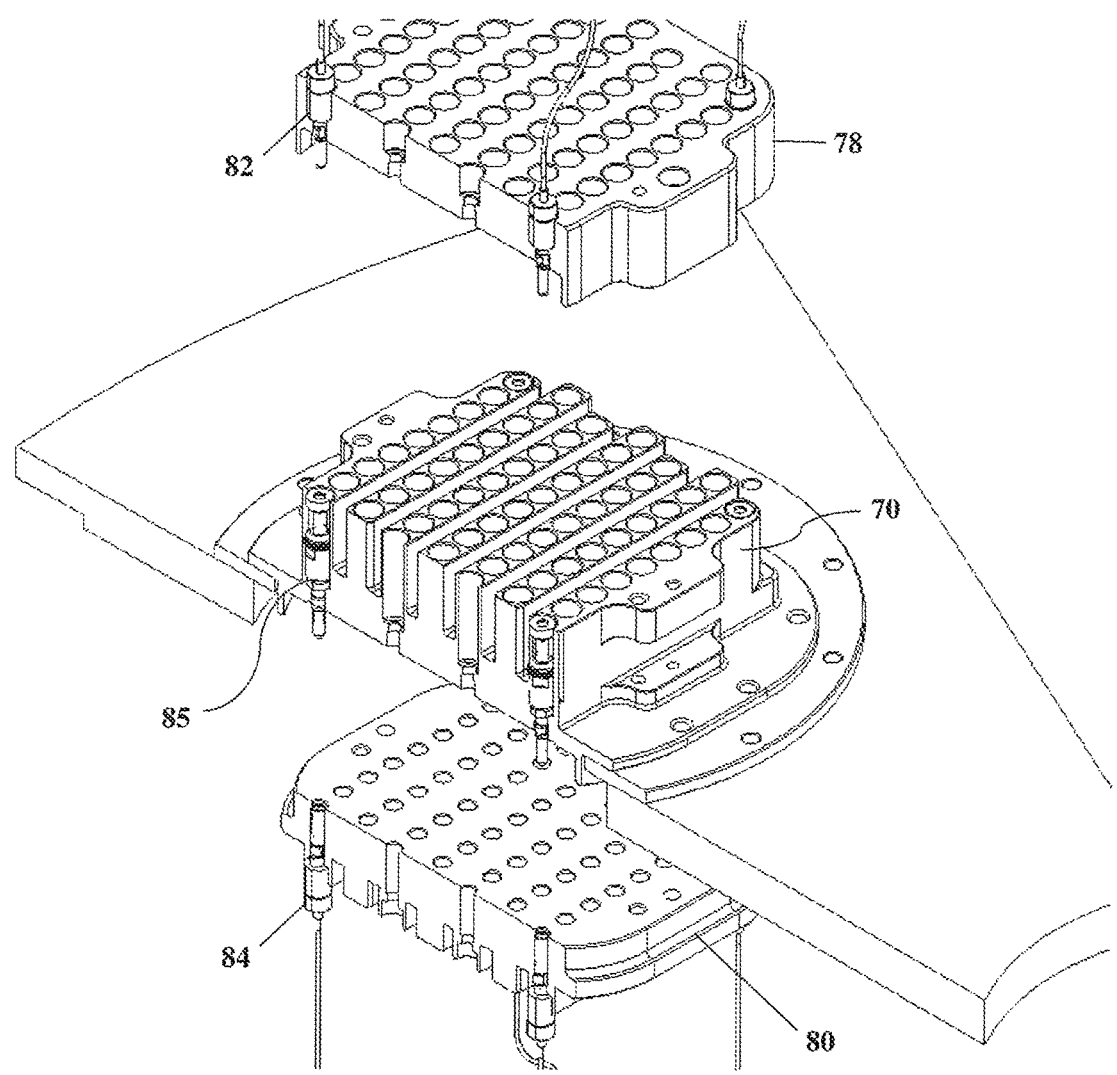
FIG. 11 depicts the separated housing blocks and the replacement of a new attenuation adaptor or other component.

FIG. 11 depicts the separated housings 78, 80 and the replacement of a new attenuation adaptor or other component 85. FIG. 12 depicts the reassembly of the connector housings 78, 80 and adaptor housing 70 with new attenuation adaptor 85.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A connection system for transmitting signal cables through tiered stages, wherein at least one stage comprises:
   a first plurality of signal cables, each having a center conductor terminated by a first constant impedance receptacle connector or first constant impedance plug connector;
   a cube-shaped or three-dimensional trapezoidal header housing mounted to a first plate, and having multiple exposed side faces, said header housing having a first header housing constant impedance receptacle connector or a first header housing constant impedance plug connector mounted on at least one of said multiple exposed side faces, and adapted to receive a constant impedance receptacle connector or a constant impedance plug connector, wherein said first header housing connector mounted on at least one of said multiple exposed side faces is complementary to said second constant impedance receptacle connector or said second constant impedance plug connector; and wherein said cube-shaped or three-dimensional trapezoidal header housing is secured to said first plate forming a hermetic seal for transporting said plurality of signal cables from an outside environment to an internal, hermetically sealed environment.

2. The connection system of claim 1 including a second connector housing securing a second plurality of signal cables, wherein said second plurality of signal cables each has a center conductor terminated by said second constant impedance receptacle connector or said second constant impedance plug connector, wherein said second connector housing's second plurality of signal cables are complementary to said first header housing constant impedance receptacle connectors or first header housing constant impedance plug connectors, such that said second connector housing attaches to said first header housing to form constant impedance cable connections.

3. The connection system of claim 1 wherein said first header housing constant impedance receptacle connector or said first header housing constant impedance plug connector is mounted on said at least one of said multiple exposed side faces in a direction facing outward relative to said first plate.

4. The connection system of claim 1 including a seal located on each side of said at least one of said multiple exposed side faces for sealing said center conductor passing therethrough.

5. The connection system of claim 1 wherein said first header housing includes a removable attenuator or filter component connected at one end to said first header housing constant impedance plug connector and at an opposing end to said first header housing constant impedance receptacle connector, for signal attenuation and/or electrical signal filtering of said first and second signal cables.

6. The connection system of claim 1 wherein said first plate is a heat sink or a ground potential or both for constant impedance connectors, attenuators, and/or filters.

7. The connection system of claim 1 wherein said first plate is a refrigeration plate.

8. The connection system of claim 1 wherein said first header housing includes a mounting base for attachment to said first plate.

9. The connection system of claim 8 wherein said mounting base is attached to said first plate by compression lugs.

10. The connection system of claim 2 wherein said second constant impedance receptacle connector or said second constant impedance plug connector of said second cable includes an attenuator or filter component embedded therein for signal attenuation and/or electrical signal filtering of said first and second signal cables.

11. The connection system of claim 1 wherein additional connection system stages are connected to said at least one stage.

12. The connection system of claim 1 including:
a plug housing block or a receptacle housing block for terminating said second plurality of signal cables, wherein said plug housing block includes a constant impedance plug connector for each of said second plurality of signal cables, or a constant impedance receptacle connector for each of said second plurality of signal cables;
an adaptor housing having a plurality of apertures for mounting attenuator housings, filter housings, or both, each of said attenuator housings and/or filter housings associated with a signal cable, and having a complementary constant impedance connector on a first side of said adaptor housing for connecting with a reciprocal constant impedance connector of said plug housing block; and
a receptacle housing block for connecting to said adaptor housing on a second side, said receptacle housing block including constant impedance plug connectors in electrical communication with said second plurality of signal cables, or constant impedance receptacle connectors in electrical communication with said second plurality of signal cables, and having a third plurality of signal cables extending therefrom;
wherein said receptacle housing block connected to said adaptor housing on said adaptor housing second side, such that a complementary constant impedance connector of receptacle housing block connects to a complementary constant impedance connector of said adaptor housing second side.

13. The connection system of claim 12 wherein said attenuator housing, said filter housing, or both, each include a resilient component for electrical communication, thermal communication, electromagnetic interference protection, or any combination thereof, to an inner wall of each respective aperture of said adaptor housing.

14. The connection system of claim 13 including at least one additional plate for mounting a second lower housing stage, said second lower housing stage comprising modified constant impedance connectors in electrical communication with said third plurality of signal cables, said modified constant impedance connectors each having a second attenuator or second filter component embedded therein for signal attenuation or electrical signal filtering.

15. The connection system of claim 1 including at least one signal cable board internal to said cube-shaped or three-dimensional trapezoidal header housing for each of said multiple exposed side faces having constant impedance receptacle or plug connectors, said signal cable board having a plurality of signal cable terminations in corresponding electrical communication with said first plurality of signal cables.

16. A connection system for transmitting signal cables through tiered stages, wherein at least one stage comprises:
a first plurality of signal cables, each having a center conductor terminated by a first constant impedance receptacle connector or first constant impedance plug connector;
a cube-shaped header housing mounted to a first plate, and having multiple exposed side faces and a top face wherein each side face and said top face present constant impedance receptacle connectors or constant impedance plugs mounted thereon, and are adapted to receive reciprocal constant impedance receptacle connectors or a constant impedance plug connectors, such that said first header housing connector or plug is complementary to said second constant impedance receptacle connector or said second constant impedance plug connector; and
wherein said cube-shaped header housing is secured to said first plate forming a hermetic seal for transporting said plurality of signal cables from an outside environment to an internal, hermetically sealed environment.

17. The connection system of claim 16 including a second connector housing securing a second plurality of signal cables, wherein said second plurality of signal cables each has a center conductor terminated by said second constant impedance receptacle connector or said second constant impedance plug connector, wherein said second connector housing's second plurality of signal cables are complementary to said first header housing constant impedance receptacle connectors or first header housing constant impedance plug connectors, such that said second connector housing attaches to said first header housing to form constant impedance cable connection.

\* \* \* \* \*